United States Patent
Chen et al.

(10) Patent No.: US 11,396,174 B2
(45) Date of Patent: Jul. 26, 2022

(54) BONDING DEVICES AND BONDING METHODS FOR CURVED COVER PLATES WITH IRREGULAR SHAPE AND FLEXIBLE SCREEN

(71) Applicant: Yungu (Gu' an) Technology Co., Ltd., Langfang (CN)

(72) Inventors: Long Chen, Langfang (CN); Xiuyu Zhang, Langfang (CN); Guizhou Qiao, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 587 days.

(21) Appl. No.: 16/454,092

(22) Filed: Jun. 27, 2019

(65) Prior Publication Data
US 2019/0315111 A1    Oct. 17, 2019

Related U.S. Application Data

(63) Continuation of application No. PCT/CN2018/111276, filed on Oct. 22, 2018.

(30) Foreign Application Priority Data

Apr. 20, 2018  (CN) .......................... 201810362551.0

(51) Int. Cl.
*B32B 37/12* (2006.01)
*G06F 1/16* (2006.01)
*G02F 1/1333* (2006.01)

(52) U.S. Cl.
CPC ........ *B32B 37/1284* (2013.01); *G06F 1/1652* (2013.01); *B32B 2457/20* (2013.01);
(Continued)

(58) Field of Classification Search
CPC ......... H01L 2251/5338; H01L 51/0097; H01L 51/56; Y10T 156/1028; G02F 1/133331;
(Continued)

(56) References Cited

U.S. PATENT DOCUMENTS 10,518,515 B2    12/2019  Choi et al.
11,005,071 B2     5/2021  Yamazaki et al.
(Continued)

FOREIGN PATENT DOCUMENTS

CN    103778857 A    5/2014
CN    104309264 A    1/2015
(Continued)

OTHER PUBLICATIONS

Office Action of CN Patent Application No. 202010956792.5 dated Oct. 28, 2021.
(Continued)

*Primary Examiner* — Carson Gross
(74) *Attorney, Agent, or Firm* — Kilpatrick Townsend & Stockton

(57) ABSTRACT

A bonding device for attaching a curved cover plate with an irregular shape to a flexible screen includes: a first attaching half having a first abutting wall, a second half, and a driving component. The first abutting wall includes a first curved wall and a first flat wall. The first curved wall matches with an inner surface of the arc hook area, and the first flat wall is smoothly connected to the first curved wall. The second attaching half has a second abutting wall. The second abutting wall includes a second curved wall and a second flat wall. The second curved wall matches with an inner surface of the arc hook area. The second flat wall is smoothly connected to the second curved wall. The driving component drives the first attaching half and the second attaching half to move relative to each other.

19 Claims, 5 Drawing Sheets

(52) U.S. Cl.
CPC .... *G02F 1/133354* (2021.01); *G02F 2201/56* (2013.01); *H01L 2251/5338* (2013.01); *Y10T 156/1028* (2015.01)

(58) Field of Classification Search
CPC ........... G02F 1/133305; B32B 38/1866; B32B 2457/20; B32B 2457/206; B32B 37/0046
See application file for complete search history.

(56) References Cited

U.S. PATENT DOCUMENTS

| | | | |
|---|---|---|---|
| 2014/0345791 | A1 | 11/2014 | Son et al. |
| 2016/0202728 | A1 | 7/2016 | Kim |
| 2017/0263492 | A1* | 9/2017 | Son .................... H01L 27/1262 |
| 2018/0301643 | A1 | 10/2018 | Xu |
| 2019/0165331 | A1 | 5/2019 | Shang |
| 2019/0355919 | A1 | 11/2019 | Lu et al. |

FOREIGN PATENT DOCUMENTS

| | | |
|---|---|---|
| CN | 104471630 A | 3/2015 |
| CN | 105930011 A | 9/2016 |
| CN | 205653917 U | 10/2016 |
| CN | 106097893 A | 11/2016 |
| CN | 107016936 A | 8/2017 |
| CN | 107020785 A | 8/2017 |
| CN | 107039604 A | 8/2017 |
| CN | 107379567 A | 11/2017 |
| CN | 206819319 U | 12/2017 |
| CN | 107591428 A | 1/2018 |
| CN | 206870666 U | 1/2018 |
| CN | 107688403 A | 2/2018 |
| CN | 107765921 A | 3/2018 |
| CN | 107863005 A | 3/2018 |
| JP | 2011003537 A5 | 6/2013 |
| JP | 5852244 B2 * | 2/2016 ......... B32B 37/0046 |
| KR | 20160043686 A | 4/2016 |
| KR | 20180013370 A | 2/2018 |
| KR | 20180025429 A | 3/2018 |
| WO | 2014021192 A1 | 2/2014 |
| WO | 2014021198 A1 | 2/2014 |

OTHER PUBLICATIONS

Notice of Allowance of JP Patent Application No. 2020-537610.
Supplementary European Search Report of EP 18914970.1.
Office Action of JP Patent Application No. 2020-537610.
Notice of Allowance of KR Patent Application No. 10-2020-7019333.
CN First Office Action dated Apr. 12, 2019 in the corresponding CN application (application No. 201810362551.0).
Notice of Allowance of CN Patent Application No. 202010956792.5 dated Mar. 16, 2022.

* cited by examiner

BONDING DEVICES AND BONDING METHODS FOR CURVED COVER PLATES WITH IRREGULAR SHAPE AND FLEXIBLE SCREEN

CROSS REFERENCE TO RELATED APPLICATIONS

The present application is a continuation application of International Application No. PCT/CN2018/111276, filed Oct. 22, 2018, and claims the priority to Chinese application No. 201810362551.0 filed Apr. 20, 2018, and which are incorporated herein by reference in their entireties.

BACKGROUND

The flexible screen is a new growth point of the future industry, and the characteristic of flexibility of the flexible screen are continuously exploited and utilized. For example, by attaching the flexible screen to a 3D fixed curved cover plate (both sides of the cover plate are a quarter of arc), the display of the front and sides of the product can be realized.

At present, a conventional attaching method of the flexible screen is to abut the flexible onto the inner side of a glass cover plate via s silicon pad.

SUMMARY

Accordingly, it is necessary to provide a new attaching device.

A bonding device for attaching a curved cover plate with an irregular shape to a flexible screen is provided. The curved cover plate with the irregular shape includes a flat area and a pair of arc hook areas extending from the flat area and located on opposite sides of the flat area. The device includes a first attaching half, a second attaching half, and a driving component. The first attaching half has a first abutting wall formed on a periphery thereof. The first abutting wall includes a first curved wall and a first flat wall. The first curved wall matches with a shape of an inner surface of the arc hook area on one side of the curved cover plate with the irregular shape, and the first flat wall is smoothly connected to the first curved wall. The second attaching half has a second abutting wall formed on a periphery thereof. The second abutting wall includes a second curved wall and a second flat wall, the second curved wall matches with a shape of an inner surface of the arc hook area on another side of the curved cover plate with the irregular shape, and the second flat wall is smoothly connected to the second curved wall. The first attaching half and the second attaching half have a closed position where the first flat wall abuts against the second flat wall on a same plane, and an open position where the first flat wall and the second flat wall are separated from each other. In the closed position, the first flat wall and the second flat wall abut a middle portion of the flexible screen onto an inner surface of the flat area of the curved cover plate with the irregular shape. In the open position, the first curved wall and the second curved wall abut edges of the flexible screen onto the inner surfaces of the arc hook areas of the curved cover plate with the irregular shape. The driving component is capable of driving the first attaching half and the second attaching half to move relative to each other, to switch the first attaching half and the second attaching half between the closed position and the open position.

In addition, the first attaching half and the second attaching half are symmetrically arranged.

In addition, the bonding device further includes a positioning tool provided with a positioning groove capable of receiving the curved cover plate with the irregular shape.

In addition, the first attaching half has a first flange extending away from the second attaching half, the first curved wall is located on the first flange, the second attaching half has a second flange extending away from the first attaching half, and the second curved wall is located on the second flange.

In addition, the driving component includes a first plugging member and a second plugging member. The first attaching half has a first slot matching with the first plugging member, and an extending direction of the first slot is inclined relative to a relative moving direction of the first attaching half and the second attaching half. The second attaching half has a second slot matching with the second plugging member, and an extending direction of the second slot is inclined relative to the relative moving direction of the first attaching half and the second attaching half. The first plugging member is inserted into the first slot and movable along a direction perpendicular to the relative moving direction, and the second plugging member is inserted into the second slot and movable along the direction perpendicular to the moving direction, so as to drive the first attaching half and the second attaching half to switch between the closed position and the open position.

In addition, the first plugging member and the second plugging member are symmetrically arranged.

In addition, an angle formed between the extending direction of the first slot and the extending direction of the second slot ranges from 45 degree to 60 degree.

In addition, the first plugging member is in clearance fit with the first slot, and the second plugging member is in clearance fit with the second slot.

In addition, the first plugging member and/or the second plugging member are telescopic.

In addition, the driving component further includes a connecting member, the first plugging member and the second plugging member are mounted on the connecting member.

In addition, the bonding device further includes a first telescopic cylinder connected to the connecting member and capable of controlling the first plugging member and the second plugging member to move along the direction perpendicular to the relative moving direction.

In addition, the driving component further includes a handle portion fixed to the connecting member.

In addition, the first abutting wall and the second abutting wall are respectively provided with a plurality of vacuum adsorption holes.

In addition, the driving component includes a second telescopic cylinder connected to the first attaching half and a third telescopic cylinder connected to the second attaching half, and the second telescopic cylinder and the third telescopic cylinder are capable of driving the first attaching half and the second attaching half to move relative to each other.

In addition, the bonding device for the curved cover plate with the irregular shape and the flexible screen further includes a power component moving the first attaching half and the second attaching half into an interior of the curved cover plate with the irregular shape or move the first attaching half and the second attaching half out of the interior of the curved cover plate with the irregular shape.

The present disclosure further provides a method of attaching a curved cover plate with an irregular shape to a flexible screen using the bonding device. The bonding device includes a first attaching half, a second attaching half, and a driving component. The first attaching half includes a first abutting wall having a first flat wall, the second attaching half includes a second abutting wall having a second flat wall. The curved cover plate with the irregular shape includes a flat area and an arc hook area. The method includes: closing the first attaching half and the second attaching half, and attaching the flexible screen to the first abutting wall and the second abutting wall, and obtaining an initial body; inserting the initial body into an interior of the curved cover plate with the irregular shape, abutting a middle portion of the flexible screen onto an inner surface of the flat area of the curved cover plate with the irregular shape via the first flat wall and the second flat wall, the first attaching half and the second attaching half is in a closed position; and driving the driving component to move the first attaching half and the second attaching half respectively along a direction towards the arc hook area to an open position.

In addition, the first abutting wall and the second abutting wall are respectively provided with a plurality of vacuum adsorption holes. The step of attaching the flexible screen to the first abutting wall and the second abutting wall includes: attaching the flexible screen to the first abutting wall and the second abutting wall via vacuum adsorption. The step of driving the driving component includes: reducing an attaching force between the flexible screen and the first abutting wall and the second abutting wall via reducing an adsorption pressure of the vacuum adsorption, thereby driving the driving component.

In addition, the flexible screen or the curved cover plate with the irregular shape is attached with bonding adhesive layer configured to adhere the curved cover plate with the irregular shape and the flexible screen together.

In the aforementioned device, the first attaching half and the second attaching half have the first flat wall and the second flat wall used to abut the curved cover plate with the irregular shape, respectively, and have the first curved wall and the second curved wall used to abut the arc hook areas of the curved cover plate with the irregular shape, respectively. The first attaching half and the second attaching half are driven by the driving component to move to both sides respectively, different areas of the flexible screen are attached in different steps, thereby sufficiently attaching the arc hook area of the curved cover plate with the irregular shape and further improving the attaching effect.

DETAILED DESCRIPTION OF THE EMBODIMENTS

Figure 1:
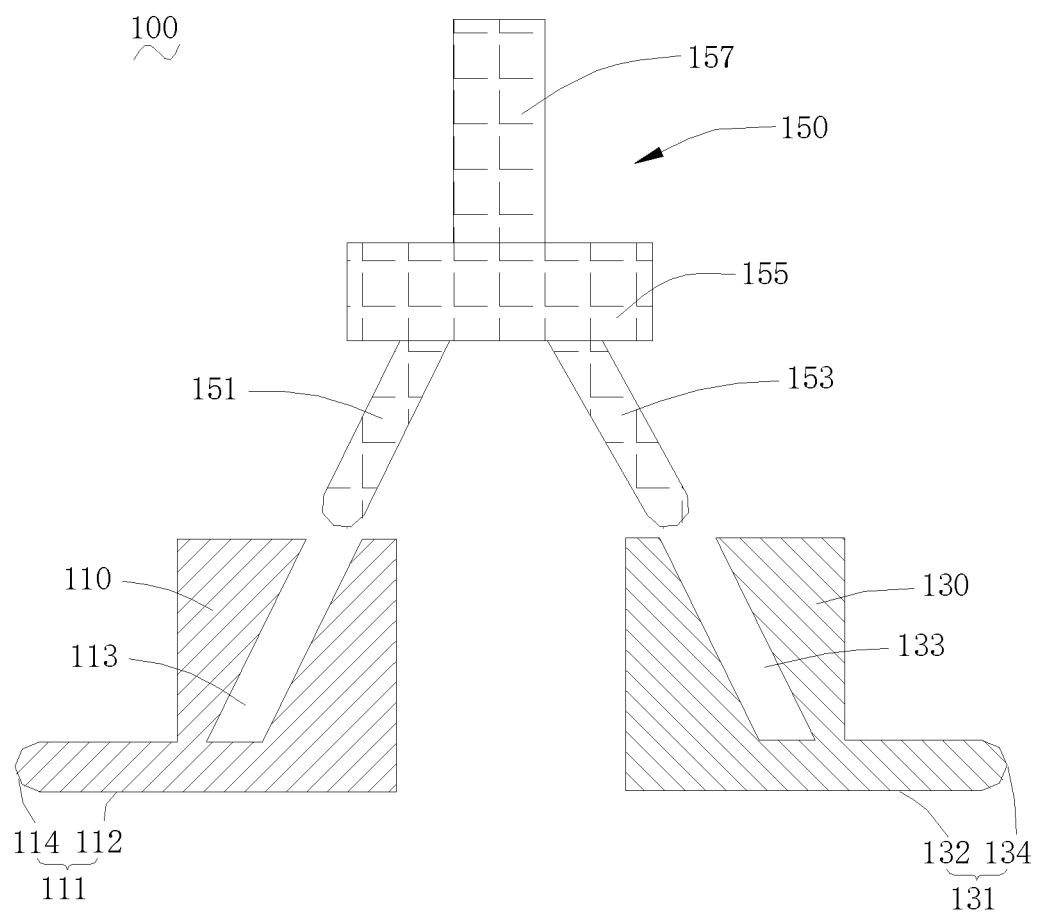
FIG. 1 is a cross-sectional view of a device for attaching a curved cover plate with an irregular shape and a flexible screen according to an embodiment of the present disclosure.

As explained above, it is desirable to manufactured curved screens. However, a conventional attaching device can only perform attaching to the 3D fixed curved cover plate, when the cover plate is designed to be bent inwardly, that is, when the cover plate has an irregular shape, the attaching cannot be implemented by the conventional attaching device.

Embodiments of the present disclosure are described more fully hereinafter with reference to the accompanying drawings, in which some embodiments of the present disclosure are shown. The various embodiments of the present disclosure may, however, be embodied in many different forms and should not be construed as limited to the embodiments set forth herein.

It will be understood that when an element is referred to as being "fixed" to another element, it can be directly fixed to the other element or intervening elements may be present. Also, when an element is referred to as being "connected" or "coupled" to another element, it can be directly connected or coupled to the other element or intervening elements may be present. As used herein, the terms "vertical", "horizontal", "left", "right" and the like are merely for the illustrative purpose.

Unless otherwise defined, all terms (including technical and scientific terms) used herein have the same meaning as commonly understood by one of ordinary skill in the art to which this invention belongs. The terms used herein is for the purpose of describing particular embodiments only and is not intended to limit the present disclosure. As used herein, the term "and/or" includes any and all combinations of one or more of the associated listed items.

As shown in FIG. 1 to FIG. 5, a bonding device 100 is used to attach a flexible screen 2 to an inner surface of a cover plate 3 with an irregular shape. The cover plate 3 with the irregular shape includes a flat area 31 with a planar shape, and a pair of arc hook areas 33 extending from the flat area 31 and located on both opposite sides of the flat area 31, and the arc hook areas 33 smoothly extends from the flat area 31. In other words, the flat area 31 is located in a center position, and two arc hook areas 33 are formed by bending opposite sides of the flat area 31 inwardly, respectively. In the illustrated embodiment, the arc hook areas 33 has a shape of semi-circular that is tangential to the flat area 31. It should be noted that, in the illustrated embodiment, the both opposite sides of the flat area 31 are virtual edges, which are also virtual boundaries between the flat area 31 and the arc hook areas 33.

The bonding device 100 for attaching the curved cover plate with the irregular shape to the flexible screen includes a first attaching half 110 having a first flat wall 112 and a second attaching half 130 having a second flat wall 132, which are capable of abutting an inner surface of the flexible screen, and a driving component 150 used to drive the first flat wall 112 of the first attaching half 110 and the second flat wall 132 of the second attaching half 130 to move relative to each other along the same plane.

Specifically, the first attaching half 110 has a first abutting wall 111 formed on a periphery thereof. The first abutting wall 111 includes a first curved wall 114 matching with the shape of the inner surface of the arc hook area 33 on one side of the curved cover plate 3 with the irregular shape, and the first flat wall 112 is smoothly connected to the first curved wall 114. The first flat wall 112 matches with the inner surface of the flat area 31 of the curved cover plate 3 with the irregular shape. Specifically, the first flat wall 112 is located on a bottom of the first attaching half 110, and is used to abut the flexible screen 2 onto the flat area 31 of the curved cover plate 3 with the irregular shape. The first curved wall 114 is located at an end portion of the first attaching half 110 away from the second attaching half 130, and is used to abut an edge of the flexible screen 2 onto the inner surface of the arc hook area 33 of the curved cover plate 3 with the irregular shape.

In the illustrated embodiment, the first flat wall 112 has a planar shape, and the first curved wall 114 has a semi-circular shape matching with the inner surface of the arc acre 33. The first attaching half 110 has a first flange (not labeled) extending away from the second attaching half 130. The first curved wall 114 is located on the first flange. That is, after the first curved wall 114 is attached to the flexible screen 2, the first curved wall 114 can extend into the arc hook area 33, and allows the flexible screen 2 between the first curved wall 114 and the arc hook area 33 to be precisely abutted onto the inner surface of the arc hook area 33. In other words, a difference between the radius of the inner surface of the arc hook area 33 and the radius of the first curved wall 114 is the thickness of the flexible screen 2.

The second attaching half 130 has a second abutting wall 131 formed on a periphery thereof. The second abutting wall 131 includes a second curved wall 134 matching with the shape of the inner surface of the arc hook area 33 on another side of the curved cover plate 3 with the irregular shape. The second flat wall 132 is smoothly connected to the second curved wall 134. The second flat wall 132 matches with the inner surface of the flat area 31 of the curved cover plate 3 with the irregular shape. Specifically, the second flat wall 132 is located on the bottom of the second attaching half 130, and is used to abut the flexible screen 2 onto the flat area 31 of the curved cover plate 3 with the irregular shape. The second curved wall 134 is located at an end of the second attaching half 130 away from the first attaching half 110, and is used to abut the edge of the flexible screen 2 onto the inner surface of the arc hook area 33 of the curved cover plate 3 with the irregular shape.

In the illustrated embodiment, the second flat wall 132 has a planar shape, and the second curved wall 134 has a semi-circular shape matching with the inner surface of the arc acre 33, that is, the structure of the second curved wall 134 is the same as the structure of the first curved wall 114, and the second curved wall 134 and the first curved wall 114 are arranged opposite to each other. The second attaching half 130 has a second flange (not labeled) extending away from the first attaching half 110. The second curved wall 134 is located on the second flange. Of course, when the arc hook areas 33 on both sides of the flat area 31 has different structures, the structures of the second curved wall 134 and the first curved wall 114 can be adjusted accordingly.

The first attaching half 110 and the second attaching half 130 have a closed position where the first flat wall 112 abuts against the second flat wall 132 on the same plane, and an open position where the first flat wall 112 and the second flat wall 132 are separated from each other. In the closed position, the first flat wall 112 and the second flat wall 132 abut a middle portion of the flexible screen 2 onto the inner surface of the curved cover plate 3 with the irregular shape. In the open position, the first curved wall 114 and the second curved wall 134 are adapted to abut edges of the flexible screen 2 onto the inner surfaces of the arc hook areas 33 of the curved cover plate 3 with the irregular shape.

The driving component 150 is used to drive the first attaching half 110 and the second attaching half 130 to perform a relatively open movement or a relatively closed movement relative to each other on the same plane, such that the first attaching half 110 and the second attaching half 130 are switched between the closed position abutting against each other, or in the open position after moving to both sides of the curved cover plate with the irregular shape, respectively. When the first attaching half 110 and the second attaching half 130 are in the closed position, the first flat wall 112 and the second flat wall 132 are adjacent to each other and located on the same plane. In this way, when the first attaching half 110 and the second attaching half 130 moves from the closed position to the open position, the flexible screen 2 are subjected to a pressure from the first abutting wall 111 and the second abutting wall 131 gradually form the middle portion to the edge portion at both right and left sides shown in the figures, such that the flexible screen 2 is sufficiently abutted onto the inner surfaces of the flat area 31 and the arc hook area 33 of the curved cover plate 3 with the irregular shape.

In the illustrated embodiment, the first flat wall 112 and the second flat wall 132 are substantially rectangular. When the first attaching half 110 and the second attaching half 130 are moved adjacent to each other, the side of the first flat wall 112 coincides with the opposite side of the second flat wall 132. In other embodiments, the first flat wall 112 and the first curved wall 114 can be an integral surface, and the second flat wall 132 and the second curved wall 134 can also be an integral surface.

The first flat wall 112 and the second flat wall 132 are not limited to be rectangular. For example, the sides of the first flat wall 112 and the second flat wall 132 that coincide with each other can be curved to match with each other. In addition, the other side of the first flat wall 112 and the second flat wall 132 adjacent to the coincident sides extends over the edges of the curved cover plate 3 with the irregular shape, respectively.

Figure 2:
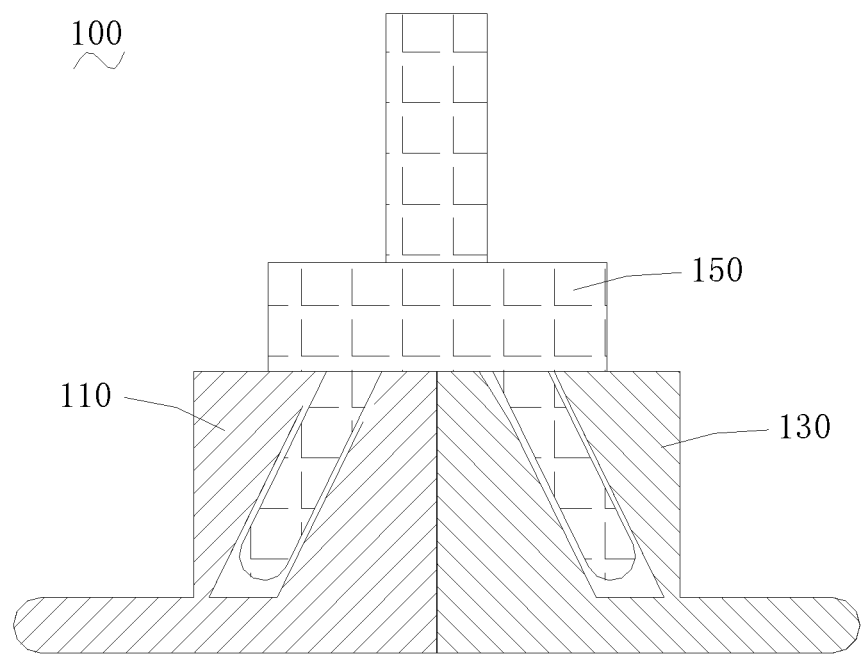
FIG. 2 is a cross-sectional view of the device of FIG. 1 in a closed position.
Figure 3:
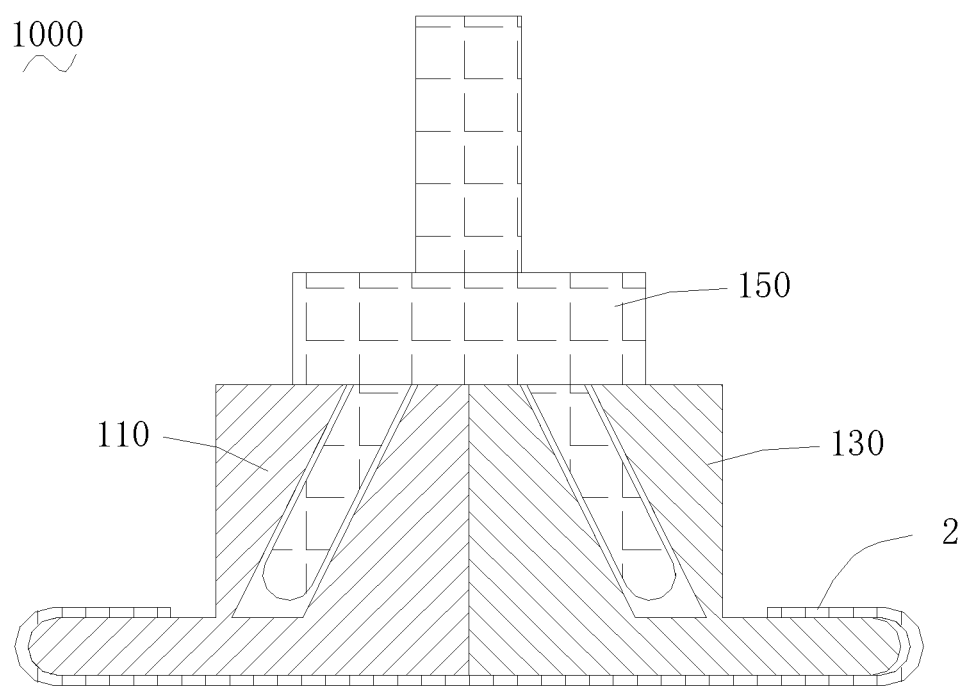
FIG. 3 is a cross-sectional view of an initial body formed by attaching a flexible screen to the device of FIG. 2.
Figure 4:
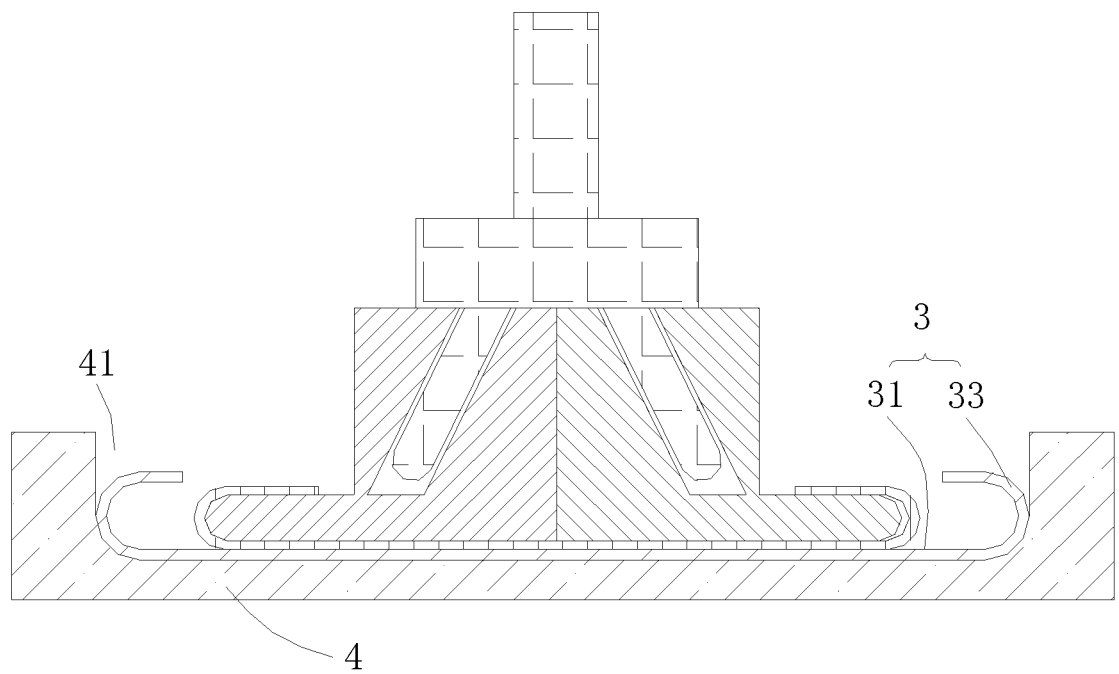
FIG. 4 is a cross-sectional view of the preliminary abutting of the initial body of FIG. 3 and a curved cover plate with an irregular shape.
Figure 5:
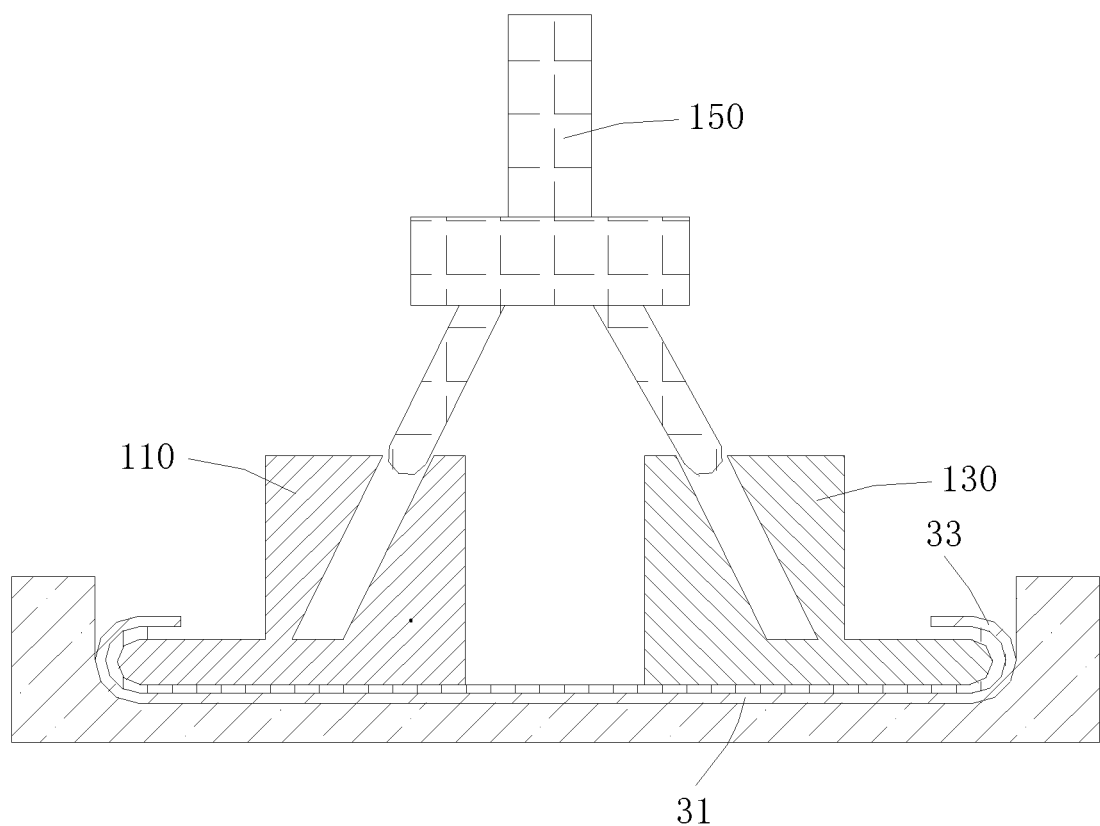
FIG. 5 is a cross-sectional view of completing abutting of the flexible screen and the curved cover plate with the irregular shape via the device of FIG. 1.

It should be understood that, when the first attaching half 110 and the second attaching half 130 are in the closed position, the overall distance between the first flat wall 112 and the second flat wall 132 along the left-right direction in FIG. 2 to FIG. 4 is less than the distance of the flat area 31 of the curved cover plate 3 with the irregular shape, such that the first attaching half 110 and the second attaching half 130 have space for moving to left and right sides. The overall length of the first flat wall 112 and the second flat wall 132 along the left-right direction in FIG. 2 to FIG. 4 is less than the length of an opening formed by the curved cover plate 3 with the irregular shape along the left-right direction, such that the device in the closed position can be inserted into the interior of the curved cover plate 3 with the irregular shape through the opening of the curved cover plate 3 with the irregular shape during attaching the curved cover plate 3 with the irregular shape and the flexible screen 2.

In one embodiment, the first attaching half 110 and the second attaching half 130 are symmetrically arranged, so as to facilitate operation.

In one embodiment, the device further includes a positioning tool 4. The positioning tool 4 is provided with a positioning groove 41 accommodating the curved cover plate 3 with the irregular shape. The positioning groove 41 serves to position the curved cover plate 3 with the irregular shape and protect the curved cover plate 3 with the irregular shape from deformation under pressure.

In the illustrated embodiment, the driving component 150 includes a first plugging member 151 and a second plugging member 153. Accordingly, the first attaching half 110 has a first slot 113 matching with the first plugging member 151. An extending direction of the first slot 113 is inclined with respect to the relative moving direction (i.e., the left-right direction in the figures) of the first attaching half 110 and the second attaching half 130. The second attaching half 130 has a second slot 133 matching with the second plugging member 153. An extending direction of the second slot 133 is inclined with respect to the relative moving direction of the first attaching half 110 and the second attaching half 130. The first plugging member 151 is adapted to be inserted into the first slot 113 and movable along a direction perpendicular to the relative moving direction, that is, the first plugging member 151 can move along the up-down direction. The second plugging member 153 is adapted to be inserted into the second slot 133 and movable along the direction perpendicular to the moving direction, so as to drive the first attaching half 110 and the second attaching half 130 to switch between the closed position and the open position.

The first plugging member 151 is in clearance fit with the first slot 113, and the second plugging member 153 is in clearance fit with the second slot 133.

In the illustrated embodiment, the first plugging member 151 and the second plugging member 153 are symmetrically arranged. In this way, the first plugging member 151 and the second plugging member 153 can be conveniently inserted into the first slot 113 and the second slot 133, respectively, so as to prevent the driving component 150 from not being inserted due to reversal.

An extending line of the first plugging member 151 away from the first attaching half 110 intersects an extending line of the second plugging member 153 away from the second attaching half 130, so as to simplify the structure of the driving component 150. An angle formed between the extending direction of the first slot and the extending direction of the second slot ranges from 45 degree to 60 degree. On the one hand, the first plugging member 151 and the second plugging member 153 can attach to the first attaching half 110 and the second attaching half 130 by moving an appropriate distance. On the other hand, the driving component 150 occupies a less space along the left-right direction (that is, the relative moving direction of the first attaching half and the second attaching half).

Specifically, the driving component 150 further includes a connecting member 155. The first plugging member 151 and the second plugging member 153 are fixedly connected to the connecting member 155, that is, the end of the first plugging member 151 away from the first attaching half 110 is connected to the end of the second plugging member 153 away from the second attaching half 130 through the connecting member 155. The plugging members and the connecting member can be connected by a hinge, a detachable connection or the like. Of course, the upper end of the first plugging member 151 can be directly fixedly connected to the upper end of the second plugging member 153, or the relative fixing between the first plugging member 151 and the second plugging member 153 can be achieved by other means.

The first attaching half 110 and the second attaching half 130 are driven to move towards the arc hook areas of the curved cover plate 3 with the irregular shape by the up and down moving of the driving component 150, respectively. Specifically, when the driving component 150 moves upward, the first attaching half 110 and the second attaching half 130 move to both sides, respectively; when the driving component 150 moves downward, the first attaching half 110 and the second attaching half 130 move towards the middle.

When the first plugging member 151 is be fully inserted into the first slot 113, and the second plugging member 153 is be fully inserted into the second slot 133, the first attaching half 110 and the second attaching half 130 are in the closed state. It should be noted that, the state in which the first plugging member 151 is fully inserted into the first slot 113, and the second plugging member 153 is fully inserted into the second slot 133 means that the first plugging member 151 cannot be inserted into the first slot 113 any further, and the second plugging member 153 cannot be inserted into the second slot 133 any further. Of course, when the first attaching half 110 is bonded to the second attaching half 130, the first plugging member 151 and the second plugging member 153 may not be completely inserted into the corresponding slots.

In the illustrated embodiment, the driving component 150 further includes a handle portion 157 relatively fixed to the connecting member 155. An operator can conveniently grasp the driving component 150 through the handle portion 157, so as to drive the driving component 150 to move up and down.

In the illustrated embodiment, the bonding device 100 further includes a first telescopic cylinder (not shown) used to control the driving component 150 to move up and down. It can effectively control the speed and time of the driving component 150 moving up and down, and save labor. The first telescopic cylinder can be a cylinder.

Additionally, the driving component 150 is not limited hereto, and can control the movements of the first attaching half 110 and the second attaching half 130 by other means, respectively. For example, the first plugging member 151 and/or the second plugging member 153 can be arranged in a telescopic structure. Alternatively, in other embodiments, the driving component 150 includes a second telescopic cylinder and a third telescopic cylinder, the second telescopic cylinder is connected to the first attaching half 110, the third telescopic cylinder connected to the second attaching half 130, and the second telescopic cylinder and the third telescopic cylinder drive the first attaching half 110 and the second attaching half 130 to move relative to each other. The second telescopic cylinder and the third telescopic cylinder can be cylinders, respectively.

The first abutting wall 111 and the second abutting wall 131 are respectively provided with a plurality of vacuum adsorption holes (not shown), such that the flexible screen 2 can be attached to the first abutting wall 111 of the first attaching half 110 and the second abutting wall 131 of the second attaching half 130 by vacuum adsorption. The flexible screen 2 can be attached to the first attaching half 110 and the second attaching half 130 by other means. For example, the left and right sides of the flexible screen 2 can both be adhered with flexible tapes, and other ends of the flexible tapes are fixed to the first attaching half 110 or the second attaching half 130 corresponding to the sides, respectively. The plurality of vacuum adsorption holes are not only provided on the first abutting wall 111 and the second abutting wall 131 of the first attaching half 110 and the second attaching half 130, but also provided on a side surface of the first attaching half 110 opposite to the first flat wall 112 and adjacent to the first curved wall 114, and provided on a side surface of the second attaching half 130 opposite to the second flat wall 132 and adjacent to the second curved wall 134. Referring to FIG. 3, the flexible screen 2 can be fully attached to an absorption surface of the first attaching half 110 and the second attaching half 130 and have a flat C-shaped structure.

The first flat wall 112 and the second flat wall 132 have the same lengths in the first attaching half 110 and the second attaching half 130 along the left-right direction in the figures, so as to facilitate operation. The first attaching half 110 and the second attaching half 130 have substantially the same structures and are symmetrically arranged.

The bonding device 100 further includes a power component (not shown) used to move the first attaching half 110 and the second attaching half 130 into the interior of the curved cover plate 3 with the irregular shape or move the first attaching half 110 and the second attaching half 130 out of the interior of the curved cover plate 3 with the irregular shape. In this way, the flexible screen 2 is attached to respective abutting walls of the first attaching half 110 and the second attaching half 130 outside the curved cover plate 3 with the irregular shape, then the first attaching half 110 and the second attaching half 130 enters the interior of the curved cover plate 3 with the irregular shape, so as to press the flexible screen 2 to the inner surface of the curved cover plate 3 with the irregular shape.

In the aforementioned device, the first attaching half 110 and the second attaching half 130 have the first flat wall 112 and the second flat wall 132 used to be abutted against by the flat area 31 of the curved cover plate 3 with the irregular shape, respectively, and have the first curved wall 114 and the second curved wall 134 used to being abutted against by the arc hook areas 33 of the curved cover plate 3 with the irregular shape, respectively. The first attaching half 110 and the second attaching half 130 are driven by the driving component 150 to open along the left-right direction. The flexible screen 2 is gradually attached to the inner surface of the curved cover plate 3 with the irregular shape from the middle to opposite sides, thereby sufficiently attaching the arc hook areas of the curved cover plate with the irregular shape and further improving the attaching effect. When the flexible screen 2 is fully attached to the curved cover plate 3 with the irregular shape, the curved cover plate 3 with the irregular shape and the bonding device 110 can be easily separated by driving the first attaching half 110 and the second attaching half 130 to move towards each other along the left-right direction.

The present disclosure further provides a method of attaching the curved cover plate 3 with an irregular shape to the flexible screen 2 using the aforementioned bonding device 100. As previously described, the bonding device 100 includes the first attaching half 110, the second attaching half 130, and the driving component 150. The first attaching half 110 includes a first abutting wall 111 having a first flat wall 112, the second attaching half 130 includes a second abutting wall 131 having a second flat wall 132, the curved cover plate 3 with the irregular shape includes a flat area 31 and an arc hook area 33. The method includes:

Step S1, the first attaching half 110 and the second attaching half 130 are closed, and the flexible screen 2 is attached to the first abutting wall 111 and the second abutting wall 131, and an initial body 1000 is obtained.

Step S2, the initial body 1000 is inserted into the interior of the curved cover plate 3 with the irregular shape, a middle portion of the flexible screen 2 is abutted onto the inner surface of the flat area 31 of the curved cover plate 3 with the irregular shape via the first flat wall 112 and the second flat wall 132, such that the first attaching half 110 and the second attaching half 130 is in a closed position.

Step S3, the driving component is driven, such that the first attaching half 110 and the second attaching half 130 move along a direction towards the arc hook area 33 of the curved cover plate 3 with the irregular shape and to the open position, respectively.

The flexible screen 2 can be a flexible OLED screen. The flexible screen 2 can be formed into other flexible screens.

In step S1, it is firstly determined that the first flat wall 112 of the first attaching half 110 is adjacent to the second flat wall 132 of the second attaching half 130, that is, the bonding device 100 is in the closed state, so as to prevent the middle portion of the flexible screen 2 from being suspended, and the generating of bubbles during the attaching process is further avoided. If the bonding device 100 is not in the closed state, the driving component is required to control the first attaching half 110 and the second attaching half 130 to move relative to each other, so as to make the bonding device 100 to be in the closed state.

Additionally, the flexible screen 2 and the curved cover plate 3 with the irregular shape can be adhered by an adhesive layer. The adhesive layer can be pre-attached onto the flexible screen 2, or be pre-attached onto the curved cover plate 3 with the irregular shape. The adhesive layer can be an OCA layer, or the adhesive layer can also be selected from other suitable adhesives.

In step S1, the step of attaching the flexible screen 2 onto the first abutting wall 111 and the second abutting wall 131 includes: attaching the flexible screen 2 to the first abutting wall 111 and the second abutting wall 131 by method of vacuum adsorption. Specifically, the first abutting wall 111 and the second abutting wall 131 are respectively provided with a plurality of vacuum adsorption holes, and the flexible screen 2 is attached to the first attaching half 110 and the second attaching half 130 by vacuum adsorption. In one embodiment, the adsorption pressure of the vacuum adsorption is substantially −80 kpa.

In step S3, the driving the driving component includes: reducing an attaching force between the flexible screen 2 and the first attaching half 110 and first abutting wall 111, and the second attaching half 130 and the second abutting wall 131 by reducing the adsorption pressure of the vacuum adsorption, thereby driving the driving component. After reducing the adsorption pressure of the vacuum adsorption, the adsorption pressure is −5 kpa to −20 kpa, for example, the adsorption pressure is −10 kpa.

According to the aforementioned bonding method, the arc hook areas 33 of the curved cover plate 3 with the irregular shape can be sufficiently attached, thereby further improving the bonding effect.

The technical features of the embodiments described above can be arbitrarily combined. In order to make the description succinct, there is no describing of all possible combinations of the various technical features in the foregoing embodiments. It should be noted that there is no contradiction in the combination of these technical features which should be considered as the scope of the description.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

The invention claimed is:

1. A bonding device for attaching a curved cover plate with an irregular shape to a flexible screen, the curved cover plate comprising a flat area and a pair of arc hook areas extending from the flat area and located on opposite sides of the flat area, the device comprising:

a first attaching half having a first abutting wall formed on a periphery thereof, the first abutting wall comprises a first curved wall and a first flat wall, the first curved wall matching with a shape of an inner surface of the arc hook area on one side of the curved cover plate, and the first flat wall being smoothly connected to the first curved wall;

a second attaching half having a second abutting wall formed on a periphery thereof, the second abutting wall comprising a second curved wall and a second flat wall, the second curved wall matching with a shape of an inner surface of the arc hook area on another side of the curved cover plate, and the second flat wall being smoothly connected to the second curved wall, wherein the first attaching half and the second attaching half have a closed position where the first flat wall abuts against the second flat wall on a same plane, and an open position where the first flat wall and the second flat wall are separated from each other, in the closed position, the first flat wall and the second flat wall abut a middle portion of the flexible screen onto an inner surface of the flat area of the curved cover plate, in the open position, the first curved wall and the second curved wall abut edges of the flexible screen onto the inner surfaces of the arc hook areas of the curved cover plate; and a driving component driving the first attaching half and the second attaching half to move relative to each other, to switch the first attaching half and the second attaching half between the closed position and the open position.

2. The bonding device according to claim 1, wherein the first attaching half and the second attaching half are symmetrically arranged.

3. The bonding device according to claim 1, further comprising a positioning tool provided with a positioning groove accommodating the curved cover plate.

4. The bonding device according to claim 1, wherein the first attaching half has a first flange extending away from the second attaching half, the first curved wall is located on the first flange, the second attaching half has a second flange extending away from the first attaching half, and the second curved wall is located on the second flange.

5. The bonding device according to claim 1, wherein the driving component comprises a first plugging member and a second plugging member;

the first attaching half has a first slot matching with the first plugging member, and an extending direction of the first slot is inclined relative to a relative moving direction of the first attaching half and the second attaching half;

the second attaching half has a second slot matching with the second plugging member, and an extending direction of the second slot is inclined relative to the relative moving direction of the first attaching half and the second attaching half;

the first plugging member is inserted into the first slot and movable along a direction perpendicular to the relative moving direction, and the second plugging member is inserted into the second slot and movable along the direction perpendicular to the moving direction, so as to drive the first attaching half and the second attaching half to switch between the closed position and the open position.

6. The bonding device according to claim 5, wherein the first plugging member and the second plugging member are symmetrically arranged.

7. The bonding device according to claim 6, wherein an angle formed between the extending direction of the first slot and the extending direction of the second slot ranges from 45 degree to 60 degree.

8. The bonding device according to claim 5, wherein the first plugging member is in clearance fit with the first slot, and the second plugging member is in clearance fit with the second slot.

9. The bonding device according to claim 5, wherein the first plugging member and/or the second plugging member are telescopic.

10. The bonding device according to claim 5, wherein the driving component further comprises a connecting member, the first plugging member and the second plugging member are mounted on the connecting member.

11. The bonding device according to claim 10, further comprising a first telescopic cylinder connected to the connecting member and controlling the first plugging member and the second plugging member to move along the direction perpendicular to the relative moving direction.

12. The bonding device according to claim 10, wherein the driving component further comprises a handle portion fixed to the connecting member.

13. The bonding device according to claim 1, wherein the first abutting wall and the second abutting wall are respectively provided with a plurality of vacuum adsorption holes.

14. The bonding device according to claim 1, wherein the driving component comprises a second telescopic cylinder connected to the first attaching half and a third telescopic cylinder connected to the second attaching half, and the second telescopic cylinder and the third telescopic cylinder driving the first attaching half and the second attaching half to move relative to each other.

15. A method of attaching a curved cover plate with an irregular shape to a flexible screen using a bonding device, the bonding device comprising a first attaching half, a second attaching half, and a driving component, the first attaching half comprising a first abutting wall having a first flat wall, the second attaching half comprising a second abutting wall having a second flat wall, the curved cover plate comprising a flat area and a pair of arc hook areas extending from the flat area and located on opposite sides of the flat area, the method comprising:

closing the first attaching half and the second attaching half, and attaching the flexible screen to the first abutting wall and the second abutting wall, and obtaining an initial body;

inserting the initial body into an interior of the curved cover plate with the irregular shape, abutting a middle portion of the flexible screen onto an inner surface of the flat area of the curved cover plate with the irregular shape via the first flat wall and the second flat wall, the first attaching half and the second attaching half is in a closed position, the first flat wall abutting against the second flat wall on a same plane when in the closed position; and driving the driving component to move the first attaching half and the second attaching half respectively along a direction towards the arc hook area to an open position.

16. The method according to claim 15, wherein the first abutting wall and the second abutting wall are respectively provided with a plurality of vacuum adsorption holes;

the attaching the flexible screen to the first abutting wall and the second abutting wall comprises: attaching the flexible screen to the first abutting wall and the second abutting wall via vacuum adsorption;

the driving the driving component comprises: reducing an attaching force between the flexible screen and the first abutting wall and the second abutting wall via reducing an adsorption pressure of the vacuum adsorption.

17. The method according to claim 15, wherein the flexible screen or the curved cover plate with the irregular shape is attached with bonding adhesive layer configured to adhere the curved cover plate with the irregular shape and the flexible screen together.

18. The method according to claim 15, further comprising:
- attaching the flexible screen to the first abutting wall and the second abutting wall through vacuum adsorption under an adsorption pressure of about −80 kPa.

19. The method according to claim 16, further comprising:
- reducing the adsorption pressure to −5 kPa to −20 kPa for separation between the flexible screen and the first abutting wall and the second abutting wall.

* * * * *